United States Patent [19]

Kaneko et al.

[11] Patent Number: 4,594,687

[45] Date of Patent: Jun. 10, 1986

[54] ADDRESS ARITHMETIC CIRCUIT OF A MEMORY UNIT UTILIZED IN A PROCESSING SYSTEM OF DIGITALIZED ANALOGUE SIGNALS

[75] Inventors: Takao Kaneko, Zama; Hironori Yamauchi; Atsushi Iwata, both of Isehara, all of Japan

[73] Assignee: Nippon Telegraph & Telephone Corporation, Tokyo, Japan

[21] Appl. No.: 517,348

[22] Filed: Jul. 26, 1983

[30] Foreign Application Priority Data

Jul. 28, 1982 [JP] Japan .................. 57-131589

[51] Int. Cl.⁴ .................. G06F 12/00; G10L 3/02
[52] U.S. Cl. .................. 364/900; 381/31; 381/41
[58] Field of Search ... 364/725, 726, 727, 200 MS File, 364/900 MS File; 381/41-45

[56] References Cited

U.S. PATENT DOCUMENTS

| | | | |
|---|---|---|---|
| 3,591,784 | 7/1971 | Cutter | 364/726 |
| 3,662,115 | 5/1972 | Saito | 179/15 A |
| 3,748,451 | 7/1973 | Ingwersen | 364/728 |
| 3,875,391 | 4/1975 | Shapiro | 364/200 |
| 4,181,976 | 1/1980 | Collins | 364/900 |
| 4,393,468 | 7/1983 | New | 364/726 |

FOREIGN PATENT DOCUMENTS 52-135629 12/1977 Japan .

OTHER PUBLICATIONS

A A. C. D. de Figueivedo paper entitled "High-Speed Technique for Digital Signal Processing", Proceeding of 1979 ISCAS, pp. 977 and 978.
A Richard Klahn et al paper entitled "The Time-Saver: FFT Hardware", Electronics, Jun. 24, 1968, pp. 92-97.
Fumitada Itakura et al, paper entitled "A Hardware Implementation of a New Narrow to Medium Band Speech Coding", I.E.E.E. International Conference on Acoustics, Speech and Signal Proceeding, 1982, May, pp. 1964-1967.
A Wen-Hsiung Chen et al paper entitled "A Fast Computational Algorither for the Discrete Cosine Transform", I.E.E.E. Transactions on Communications, vol. COM-25, No. 9, Sep. 1977, pp. 1004-1009.
A James L. Flanagan et al paper entitled "Speech Coding", I.E.E.E. Transaction on Communications, vol. COM-27, No. 4, Apr. 1979, pp. 710 through 737.
A paper of Masaki Honda et al of the title "Adaptive Bit Allocation Scheme in Predictive Coding of Speech", I.E.E.E. International Conference on Acoustics, Speech and Signal Processing, May 1982, pp. 1672 through 1675.
A paper of Raine Zelinski et al, I.E.E.E. Transaction on Acoustics, Speech and Signal Processing, vol. ASS-D-25, No. 4, Aug. 1977, pp. 299-309.

*Primary Examiner*—James D. Thomas
*Assistant Examiner*—Florin Munteanu
*Attorney, Agent, or Firm*—Charles E. Pfund

[57] ABSTRACT

A signal address arithmetic circuit is used for performing address arithmetic required for executing such analog signal algorithms as adaptive predicative coding, adaptive bit allocation in predictive coding, adaptive transform coding, etc. The address arithmetic circuit is constructed of two counters, three registers, two selectors, a shift circuit an adder and AND gate circuits. The first selector selects either one of the first counter, the second counter or a first register, and its output is applied to one input terminal of the adder. The second selector selects either one of the second counter or the third register and its output is directly applied to the other input of the adder. The output of the adder and the content of the second register for each bit are applied to the AND gate circuits and its output is set in the third register, the content thereof being used for memory addressing. According to the type of processing algorithms and corresponding addressing modes, the arithmetic circuit performs the resetting or incrementing of the two counters, controlling the selection operation of the two selection circuits, controlling the number of shifts of the shift circuit, and resetting the third register.

1 Claim, 2 Drawing Figures

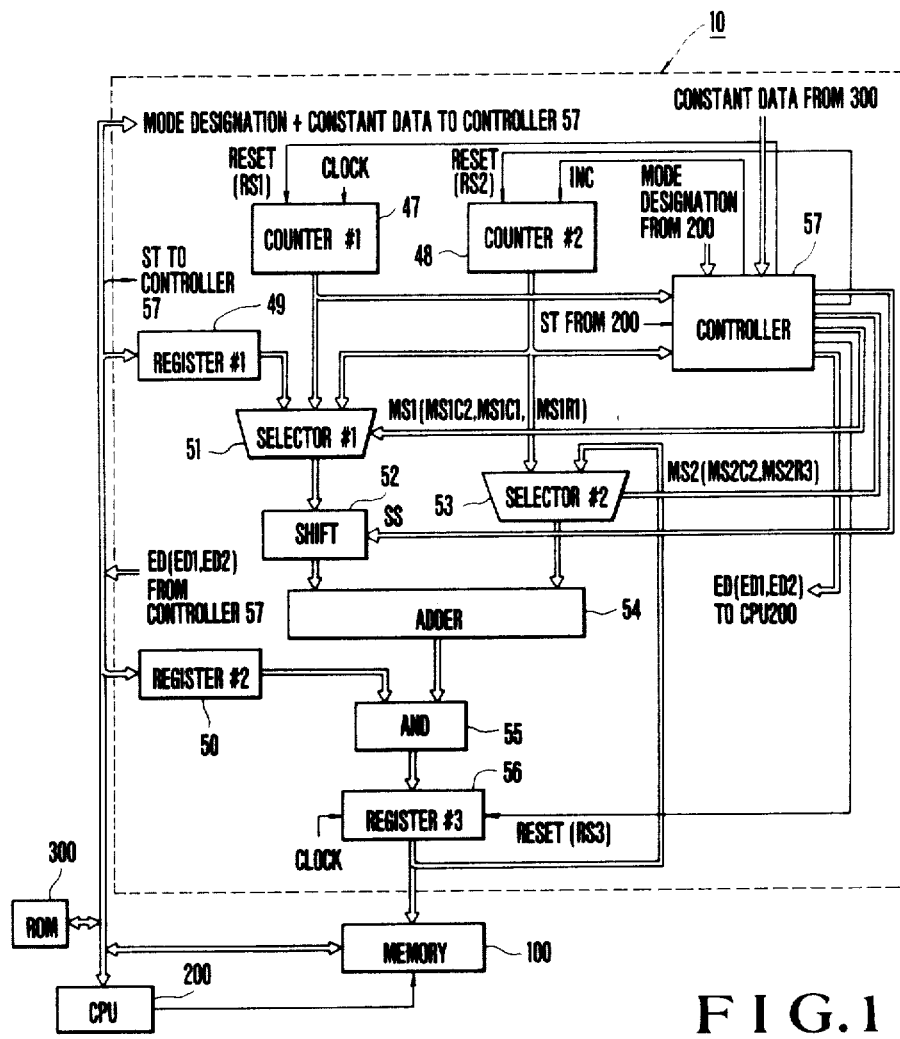
F I G. 1

ADDRESS ARITHMETIC CIRCUIT OF A MEMORY UNIT UTILIZED IN A PROCESSING SYSTEM OF DIGITALIZED ANALOGUE SIGNALS

BACKGROUND OF THE INVENTION

This invention relates to an address arithmetic circuit of a memory unit utilized in a processing system of digitalized analogue signals.

With recent development of various techniques regarding digital processings, analogue signals which have been transmitted at a high fidelity are recently digitalized. A typical example of such analogue signals are voice or speech signals.

As techniques of digitalizing voice signals are known various techniques including bit rate reduction encoding systems including Adaptive Predictive Coding with Adaptive Bit Allocation (APC-AB), Adaptive Transform Coding (ATC), Adaptive Differential Pulse Code Modulation (ADPCM) and Sub-Band Coding (SBC), and analysis synthesizing System such as Line Spectrum Pair (LSP) and Partial Autocorrelations (PARCOR); an equalizer and an echo canceller.

The outline of such high grade waveform encoding systems is disclosed in a James, L. Flanagan et al paper entitled "Speech Coding", I.E.E.E. Transactions on communications, Vol. COM-27, No. 4. April 1979, pages 710 through 737 and the detail of this system is disclosed in a paper of Masaki Honda et al of the title Adaptive Bit Allocation Scheme in Predictive Coding of Speech" I.E.E.E. International Conference on Acoustics, Speech and Signal Processing, May 1982, pages 1672 through 1675. Regarding ATC, reference is made to a paper of Raine Zelinski et al, I.E.E.E. Transaction on Acoustics, Speech, and Signal Processing, Vol. ASSP-25, No. 4 August 1977, pages 299–309, while a PARCOR system is disclosed in U.S. Pat. No. 3,662,115. Regarding LSP (modified APC), reference is made to Fumitada Itakura et al paper entitles "A Hardware Implementation of a New Narrow to Medium Band Speech Coding, I.E.E.E. International Conference on Acoustics, Speech and Signal Processing, 1982, May pages 1964–1967.

In such processing systems of voice or speech signals, generally a voice signal is sampled and data of several hundreds of samples are processed as one frame unit. For effecting this processing the data are once stored in a memory unit under the arithmetic of a digital signal processor, and the data thus stored are accessed according to a specific algorithm determined by various speech processing systems for performing a necessary address arithmetic. In this case, for accessing the data stored in the memory unit (actually there is a look-up table in addition to the data) an accurate address arithmetic according to a predetermined algorithm is required.

Same examples of various speech processing systems are given in the following Table I which shows the relation between speech processing systems and address modes utilized thereby.

TABLE I

| speech processing system | address mode | | | |
|---|---|---|---|---|
| | increment | cycle (APC) | modulo (DFT, DCT) | bit reverse (FFT) |
| ACCURATE WAVEFORM ENCODING SYSTEM | | | | |
| APC-AB | indispensable for ordinary processing | predictive coding | DFT or FFT for LSP analysis | |
| ATC | indispensable for ordinary processing | predictive coding | DCT is effected for orthogonal transform, which is realized at high speed with FFT | |
| ADPCM | indispensable for ordinary processing | predictive coding | — | — |
| SBC | indispensable for ordinary processing | predictive coding | conversion of signal wareform into frequency region | |
| ANALYSIS SYNTHESIZING SYSTEM | | | | |
| PARCOR | indispensable for ordinary processing | — | — | — |
| LSP | indispensable for ordinary processing | — | In LSP analysis DFT or FFT | |
| equalizer | indispensable for ordinary processing | AP adaptive predication | estimation of equalized waveform in FFT | |
| echo canceller | indispensable for ordinary processing | AP adaptive predication | estimation of echo property in FFT | |

In Table I, the increment includes processings of filtering auto-correlation, windowing etc. while addressing is executed by ordinary increase or decrease. In the cycle mode, the address is circulated with a predetermined period and this mode is used in the adaptive predictive coding (APC) processing.

In the modulo mode, a spectrum of respective sampling points are determined according to their dispersion signals and the processings include discrete. Fourier transform (DFT) processings and discrete cosine transform processings (DCT).

In the bit reverse mode in which the bit order of a data series is reversed, fast Fourier transformation (FFT) is used.

Anyhow, to execute digital processing of speech, signal processings of various modes are necessary. In the prior art, for executing processing of various modes independent address arithmetic circuits for executing respective mode processings have been provided so that address arithmetic circuits became bulky. For this reason, it has been extremely difficult to fabricate such address arithmetic circuit on a single chip large scale integration (LSI) for one digital signal processing. Following are prior references 1. U.S. Pat. No. 4,181,976 2. Japanese Laid Open Patent Specification No. 135629/1977. It was proposed to execute a complex address arithmetic for a memory unit by software utilizing a general purpose microprocessor or computer.

In such digital processing, however, it is impossible to use so-called parallee pipe line in which data calculation and address arithmetic are performed alternately, thus decreasing processing speed. When such address arithmetic is intended to be performed by software as above described, with present day technique, it is necessary to prepare a processor having an ultra high speed cycle time which is impossible or extremely difficult to realize.

SUMMARY OF THE INVENTION

Accordingly, it is the principal object of this invention to provide an address arithmetic circuit of a memory unit capable of controlling addresses of a memory unit at a high speed with a simple construction necessary for executing digital processing of digitalized analogue signals so that it can be applied to a processing system of digitalized analogue signals.

Another object of this invention is to provide a novel address arithmetic circuit of a memory unit which can be fabricated on a digital signal processing LSI for improving the performance and reducing the cost thereof and is suitable for use in a processing system of digitalized analogue signals.

Another object of this invention is to provide an address arithmetic curcuit of a memory unit for a general purpose.

To accomplish these and other objects according to this invention a single address arithmetic circuit is used for performing complex address arithmetic required for executing such processings as DFT, DCT, FFT, APC etc. which are indispensable for the processings of digial signals by using the principle of circulating addresses in which the addresses circulate with a constant period.

According to this invention, the address arithmetic circuit is constituted for controlling two counters, three registers, two selectors, a shift circuit, an adder, and an AND gate circuit. The first selector selects either one of the first counter or the second counter and a first register, and its output is applied to one input terminal of the adder. The second selector selects either one of the second counter and the third register and its output is directly applied to the other input terminal of the adder. The output of the adder and the content of the second register for each bit are applied to the input terminals of the AND gate circuit and the output thereof is set in the third register, the content thereof being used for memory addressing according to respective modes, the arithmetic circuit has a performance for resetting incrementing two counters, performs a controlling selecting operation of two selection circuits, controlling the number of shifts of the shift circuit, and resetting the third register.

According to this invention there is provided an address arithmetic circuit of a memory unit utilized for digitally processing analogue signals wherein address controls of a plurality of types required for processing plurality of types of digital signals by utilizing the memory unit, the address arithmetic circuit comprising first and second counters, first and second registers, and a third register acting as an address register of the memory unit, a first selection circuit for selecting either one of the outputs of the first or second counters and of the first register, a shift circuit for shifting an output of the first selection circuit, a second selection circuit for selecting either one of outputs of the second counter or the third register, an adder for adding together outputs of the shift circuit and the second selection circuit, an AND gate circuit for obtaining a logical product of an output of the adder and an output of the second register for each bit, and for setting the logical product in the third register, means for resetting or incrementing the first and second counters in accordance with the outputs of the first and second counters, means for controlling selection operation of the first and second selectors, means for controlling a number of shifts of the shift circuit, and means for resetting the third register.

BRIEF DESCRIPTION OF THE DRAWINGS

In the accompanying drawings:

FIG. 1 is a block diagram showing one embodiment of the address arithmetic circuit utilized in a digital processing system of analogue signals embodying this invention.

DESCRIPTION OF THE PREFERRED EMBODIMENTS

Figure 2:
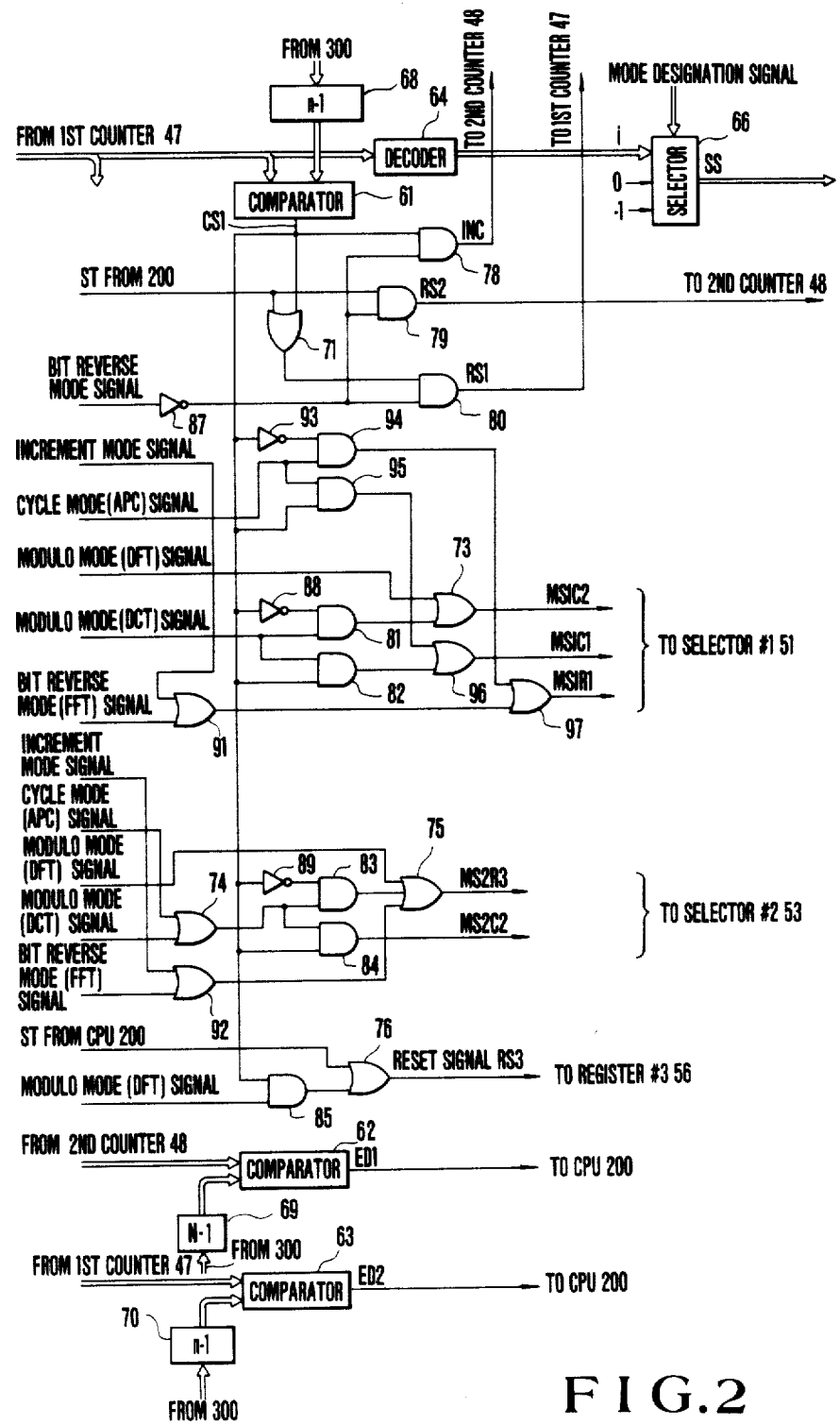
FIG. 2 is a block diagram showing the detail of a arithmetic circuit utilized in the embodiment shown in FIG. 1.

The address arithmetic circuit shown in FIG. 1 is constituted by two step counters 47 and 48, three registers 49, 50 and 56, two selectors 51 and 53, a shift circuit 52, an adder 54, an AND gate circuit 55, and a arithmetic circuit 57 which, in response to the outputs of the AND gate circuit 55 and of the counters 47 and 48, sets the counters 47 and 48, the selectors 51 and 53, and the shift circuit 52. According to the mode used, an initial value, and a constant of data to be controlled are applied to the registers 49 and 50 from a memory unit 300 under the control of a central processing unit (CPU) 200. The first selector 51 selects the outputs of register 49, first counter 47 and second counter 48 in accordance with a mode designation signal MSI given by the arithmetic circuit 57 and sends the selected output to shift circuit 52 which in accordance with the content of a shift signal SS from the arithmetic circuit 57 supplies to the first input of adder 54 after shifting a predetermined digit input to right or left or remains as it is. The second selector 53 selects the outputs of the second counter 48 and the third register 56 under the control of a selection signal MS2 from the arithmetic circuit 57 and supplies the selected output to the second input of the adder 54. The output of the adder 54 is sent to the AND gate circuit 55 together with the output of the second register 50 to obtain logical products of the two outputs for each bit. The output of the AND gate circuit 55 is sent to the third register 56 which operates as an address register to take in the output of the AND gate circuit 55 in synchronism with a clock input, the output of the third register 56 being used as an address signal of the memory unit 100. The content of the third register 56 is reset by a reset signal from the arithmetic circuit 57.

The first counter 45 comprises a binary counter and its content is reset by a reset signal RS1 from the arithmetic circuit 57 to sequentially count the number of the clock inputs, and the count of the counter 47 is sent to the first selector 51 and the arithmetic circuit 57.

The second counter 48 also comprises a binary counter and its content is reset by a reset signal RS2 from the arithmetic circuit 57. The second counter 48 sequentially counts in response to an increment signal INC from the arithmetic circuit 57 and its output is sent to the first selector 51, the second selector 53 and the arithmetic circuit 57. The arithmetic circuit 57 initiates its address arithmetic when it is supplied with a processing starting signal ST from CPU 200 for effecting a predetermined address arithmetic in accordance with a digital processing mode designation signal given from a read only memory unit (ROM, 300 or RAM, generally a arithmetic memory unit. Upon completion of a predetermined address arithmetic end signals ED1, ED2 designating termination of the processing are sent to the CPU 200. The clock utilized in this embodiment is an ordinary clock pulse or an arranged arithmetic pulse under the control of CPU 200.

The detail of the arithmetic circuit 57 is shown in FIG. 2 in which 61, 62 and 63 designate comparators, 64 a decoder, 66 a selector, 68 through 70 constant setting registers, 71, 73 through 76, 91, 92, 96 and 97 designate OR gate circuits, and 87 through 89 and 93 inverters.

When clockwise and counterclockwise circulations are made n times (n=0, 1, 2, ...) respectively constant registers 68, 69 and 70 are set to n−1 respectively. Then when the counter outputs corresponding to each of the registers 68, 69, 70 become (n−1)' (N−1) and (n−1) respectively, each of which is equal to the content of each of the registers, the corresponding comparator produces an output; and the corresponding counter is reset in synchronism with the next clock.

The comparator 61 compares the count sent from the first counter 47 with a constant (n-1) from the constant setting register 68. When they coincide with each other, the comparator 61 produces a coincidence signal CS1 for controlling reset and increment of the first and second counters 47 and 48 and the operations of the selectors 51 and 53 and the third register 56.

The coincidence signal CS1 is sent to the OR gate 71, to the AND gate circuits 78, 82, 84, 85 and 95 and to the AND gate circuit 81 via the inverter 88, to the AND gate circuit 83 via inverter 89 and to the AND gate circuit 94 via inverter 93. The address arithmetic processing starting signal ST from CPU is supplied to OR gate circuit 71 and AND gate circuit 79. The output of the OR gate circuit 71 is sent to AND gate circuit 80. The AND gate circuit 80 is also supplied with the output of inverter 87 given with a bit reverse mode designation signal. Accordingly, when the mode is not the bit reverse mode a reset signal RS1 is produced which resets the first counter 47 in response to the output of OR gate circuit 71. AND gate circuit 78 sends an increment signal INC to the second counter 48 when supplied with the output of inverter 87 and the coincidence signal CS1. AND gate circuit 79 is supplied with the processing starting signal ST from CPU 200 and the output of inverter 87 to produce a reset signal RS2 resetting the second counter 48. OR gate circuits 73, 91 and 97, inverters 88 and 93 and AND gate circuit 81, 82, 94, and 95 cooperate to produce a mode designation signal MS1 for the first selector 51.

The increment mode signal is sent to the OR gate circuit 91 together with the bit reverse mode signal, and the output of the OR gate circuit 91 is sent to the OR gate circuit 97, which produces an output acting as a mode designation signal MS1R1 which selects the first register 49. The coincidence signal CS1 is sent to one input of the AND gate circuit 94 via inverter 93. The AND gate circuit 94 sends its output to OR gate circuit 97 when supplied with a cycle mode signal APC but not supplied with the coincidence signal CS1.

The cycle mode signal APC is sent to the AND gate circuit 95 together with the coincidence signal CS1; when the AND gate circuit 95 is supplied with both signals, it produces a mode designation signal MS1C1 which selects the first counter 47 via OR gate circuit 96. A modulo mode signal DFT is sent to first selector 51 via OR gate circuit 73 to act as a mode designation signal MS1C2 which selects the second counter 48. Further, a modulo mode signal DCT is sent to the AND gate circuit 81 which is enabled, when the inverter 88 supplied with the coincidence signal CS1 does not produce an output, to the OR gate circuit 73 which produces a mode designation signal MS1C2 which selects the second counter 48.

This modulo signal DCT is applied to the AND gate circuit 82 together with the coincidence signal CS1 to cause it to produce a mode designation signal MS1C1 which selects the first counter 47 through the OR gate circuit 96.

OR gate circuits 74, 75, 92, inverter 89, and AND gate circuits 83 and 84 cooperates to form a selection signal MS2 of the second selector 53. The cycle mode designation signal APC and the modulo designation signal DCT are sent to OR gate circuit 74 and its output is sent to the AND gate circuit 83 which, when it is not supplied with the output of inverter 89, sends an output to the OR gate circuit 75 in accordance with APC or DCT signal. This OR gate circuit 75 sends to the second selector 53 a selection signal MS2R3 that selects the third register 56. Further, to the OR gate circuit 75 are inputted the modulo designation signal DFT and increment mode and bit reverse mode designation signal FFT via OR gate circuit 92 so as to produce a selection signal MS2R3. When supplied with the output of OR gate circuit 74 and the coincidence CS1, the AND gate circuit 84 sends to the second selector 53, a selection signal MS2C2 which selects the second counter 48.

AND gate circuit 85 and OR gate circuit 76 form a reset signal RS3 sent to the third register 56. More particularly, when the processing starting signal ST is sent to OR gate circuit 76 from CPU 200 the OR gate circuit 76 produces a reset signal RS3. Upon receipt of the coincidence signal CS1 and the modulo designation signal DFT, the AND gate circuit 85 is enabled to sent its output to OR gate circuit 76 which also sends out the reset signal RS3.

The second comparator 62 compares the count of the second counter 48 with a constant N−1 sent from the constant setting register 69 for sending a processing end signal ED1 showing the end of the processing of a cycle or a modulo mode to CPU 200 when the compared values coincide with each other.

The third comparator 63 compare the count of the first counter 47 with the constant n−1 sent from the constant setting register 70, and upon coincidence the comparator 63 sends a processing end signal ED2 showing the processing of increment or bit reverse mode has terminated to CPU 200.

The inputs to constant setting registers 68, 69 and 70 described above are sent from ROM 300, for example, under the control of CPU 200 when corresponding comparators perform comparisons or in relation thereto.

The output of the first counter 47 is sent to decoder 64. The decoder 64 sends out outputs showing how may bits "1" is contained continuously from the LSB in the count of the first counter 47 as shown in the following Table II. These outputs are supplied to the shift circuit 52 via the selector 66 and a signal determining the number of right and shift of the input data to the shift circuit 52 is shown by i.

TABLE II

| Count of 1st Counter 47 (Input of Decoder 64) | | Output i of Decoder 64 |
| --- | --- | --- |
| Binary Value | Decimal Value | (Decimal Value) |
| 0000 | 0 | 0 |
| 0001 | 1 | 1 |
| 0010 | 2 | 0 |

TABLE II-continued

| Count of 1st Counter 47 (Input of Decoder 64) | | Output i of Decoder 64 |
|---|---|---|
| Binary Value | Decimal Value | (Decimal Value) |
| 0011 | 3 | 2 |
| 0100 | 4 | 0 |
| 0101 | 5 | 1 |
| 0110 | 6 | 0 |
| 0111 | 7 | 3 |
| 1000 | 8 | 0 |
| . | . | . |
| . | . | . |
| . | . | . |

Selector 66 is supplied with the output i of the decoder 64 and constants "0" and "−1". The operation of this selector 66 is shown in the following Table III

TABLE III

| mode | Selector input |
|---|---|
| increment | — |
| cycle | 0 |
| modulo (DFT, DCT) | −1 |
| bit reverse | i |

The output of the selector 66 is sent to the shift circuit 52 to act as a shift signal SS.

The following Table IV show the relation between designated modes and the inputs and the outputs of the arithmetic circuit 57.

TABLE IV

| | | mode | | | |
|---|---|---|---|---|---|
| | | cycle | modulo | | bit reverse |
| outputs | increment | (APC) | DFT | DCT | FFT |
| reset signal RS1 of first counter 47 | — | when count of counter 47 is n − 1 at the time of starting processing | when count of counter 47 is n − 1 at the time of starting processing | when count of counter 47 is n − 1 at the time of starting processing | at the time of starting processing |
| reset signal RS2 of second counter 48 | — | at the time of starting processing | at the time of starting processing | at the time of starting processing | — |
| increment signal INC of second counter 48 | | when count of counter 47 is n − 1 | when count of counter 47 is n − 1 | when count of counter 47 is n − 1 | — |
| Shift signal SS | shift 0 | shift left 1 | shift left 1 | shift right i | |
| mode desingation signal MS1 | output (±a) of register 49 | count of counter 47 when output of register 49 is (1) and count of counter 47 is (n − 1) | count of counter 48 | count of counter 47 when counts of counters 47, 48 are (n − 1) and (N − 1) respectively | output of register 49 (3.2^{N−1}) |
| selection signal MS2 | output of register 56 | count of counter 48 when output of register 56 and counts of counter 48 are (n − 1) | output of register 56 | count of counter 48 when output of register 56 and count of counter 47 are (n − 1) | output of register |
| reset signal RS3 of register 56 | at the time of starting processing | at the time of starting processing | at the time of starting processing and when count of counter 47 is (n − 1) | at the time of starting processing | at the time of starting processing |

The address arithmetic circuit 10 shown in FIG. 1 operates as follows. As can be understood from the foregoing description, the address arithmetic circuit shown herein is used for digital processing of such analogue signals as various digitalized speech signals. The address arithmetic circuit 10 is constracted to operate according to the following modes.

(a) increment mode
(b) cycle mode     APC processing
(c) modulo mode    { DFT processing
                        DCT processing
(d) bit reverse mode   FFT processing various mode operations will be described as follows.

(a) increment mode

In this mode, the value of the address signal outputted from the third register acting as the address register is sequentially incremented. Furthermore in this mode, increment value (±a) is applied to the first register 49 from ROM 300, for example, under the arithmetic of CPU 200. In this mode, the arithmetic circuit 57 sends a mode designation signal MS1R1 to the selector 51, and a shift signal SS(0) of shift 0 to the shift circuit 52 to cause it to produce a selection signal MS2R3. The third register 56 has been reset at the time of starting the processing. Accordingly, the content of register 49 is sequentially added to the output of register 56 by adder 54 by the timing action of the clock. The output of adder 54 is sent to the memory unit 100 as an address signal.

(b) cycle mode . . . APC processing

The adaptive predictive coding (APC) or the linear predictive coding (LPC) is an encoding system according to which values premeasured at certain sampling points of a previous signal waveform are used to encode residual signals. The residual $e_x$ at a time t is calculated from an input signal $x_t$ and a predictive signal $\widetilde{x}_t$ according to the following equation.

$$e_t = x_t - \widetilde{x}_t \tag{1}$$

By encoding the residual $e_t$, and encoded remaining difference $\hat{e}_t$ can be obtained together with a en encded signal $\hat{x}_t$.

$$\hat{x}_t = \widetilde{x}_t + \hat{e}_t \tag{2}$$

The predictive signal $\widetilde{x}_t$ can be determined by the following equation by using the order linear predictive coefficients $\alpha_1 \sim \alpha_n$ and previous n encoded signals $\hat{x}_{t-1} \sim \hat{x}_{t-n}$ $$\tilde{x}_t = \sum_{k=1}^{n} a_k \cdot x_{t-k} \tag{3}$$

In such linear predictive encoding processing the predictive signal $\tilde{x}_t$ can generally be obtained by product and sum computations of the linear predictive coefficient $a_k$ in the memory unit and the encoded signal $\hat{x}_{t-k}$. At this time, since the encoded signal $\hat{x}_{t-k}$ sequentially utilizes new data as the encoding step proceeds, past data become sequentially unnecessary. Consequently, the addressing of the encoded signal $\hat{x}_{t-k}$ renews one by one the starting address thus repeating n times the incrementation.

According to this method, since the starting address increases with the advance of encoding step so as to minimize the memory capacity, n encoded signals $\hat{x}_{t-k}$ are stored in n word memory regions so that past encoded signals which sequentially became unnecessary are replaced by new encoded signals. Consequently as the starting address is renewed one by one it becomes necessary to circulate the addresses with a period n so that the addresses of the predictive coding can be shown in the following Table V.

TABLE V

| | | | k | | |
|---|---|---|---|---|---|
| t | 1 | 2 | 3 | ... n − 1 | n |
| 1 | 0 | 1 | 2 | ... n − 2 | n − 1 |
| 2 | 1 | 2 | 3 | ... n − 1 | 0 |
| 3 | 2 | 3 | 4 | ... 0 | 1 |
| 4 | 3 | 4 | 5 | ... 1 | 2 |
| 5 | 4 | 5 | 6 | ... 2 | 3 |
| . | . | . | . | . | . |
| . | . | . | . | . | . |
| . | . | . | . | . | . |

In this example, the cycle mode operation is as follows:

In this mode, "1" is given to the first register 49 acting as an increment register, whereas in the second register 50 acting as a circulating period register, representing the circulating period $n(=2^{I-1})$ lower order I-1 bits are all "1" and other bits are set with "0". First counter 47, second counter 48, and third register 56 are reset at the time of starting the processing. A mode designation signal MS1R1 is given to the fitst selector 51 from the arithmetic circuit 57 so as to select the output of the first register 49. A selection signal MS2R3 is applied to the second selector 51 from arithmetic circuit 57 so as to select the output of the third register 56. A shift designation signal SS(0) (not to shift) is sent to the shift circuit 52 from the arithmetic circuit 57. The address generated by the third register 56 and the increment of the first register are added together by the adder 54 and the sum and the data of the second register 50 are inputted to the AND gate circuit 55, for each bit, and the output of the AND gate circuit 55 is supplied to the third register 56 to form the next address. The first counter 47 is incremented one by a clock input each time the third register 56 is renewed. When the third register 56 produces an address (n − 1) and when the output of the first counter 47 becomes (n − 1) the arithmatic circuit 57 operates as follows to clear the first counter 47, thereby incrementing the second counter 48. When the count of the first counter 47 becomes equal to a constant (n − 1) comparator 61 sends out a coincidence signal CS1. In response to this coincidence signal CS1 the AND gate circuits 80 and 78 are enabled to output a reset signal RS1 and an increment signal INC.

At the same time, the generation of the coincidence signal CS1 changes the mode designation signals MS1 and MS2 for the first and second selectors 51 and 53. To the first selector 51 is supplied the mode designation signal MS1C1 via the OR gate circuits 95 and 96 for selecting the output of the first counter 47, whereas the second selector 53 is supplied with the selection signal MS2C2 via AND gate circuit 84 for selecting the output of the second counter 48. Consequently, the count of the second counter 48 is set in the third register 56.

Consequently, the starting address is renewed one after one. Upon renewal of the starting address, the selectors 51 and 53 return to the initial states for selecting outputs of the first and second registers 49 and 50 respectively. The above described operation is repeated until the output of the second counter 48 reaches a required number N − 1 of APC.

With the address arithmetic circuit, even when the address generated by the third register 56 becomes the last address (n − 1) by executing a normal addition operation of the output of the third register 56 and the carry of more than I bits from a lower order bit effected by the AND gate circuit 55 is neglected, the address of the next third register 56 automatically becomes the initial address 0. Consequently predictively encoded address circulation with a period n can be obtained continuously.

(c) modulo cycle ... DFT and DCT processings

These processings are indispensable for the digital signal processings for determining a spectrum of dispersed signals regarding respective sampling points, and the transform equations are as follows.

$$X(k) = C \sum_{n=0}^{N-1} x(n)\exp\left(-j\frac{2\pi}{N}kn\right) \tag{4}$$

$$Y(k) = D \sum_{n=0}^{N-1} y(n)\cos\frac{(2n+1)k\pi}{2N} \tag{5}$$

where x(n) and y(n) respectively represent dispersion signals of respective sampling points before executing DFT and DCT processings and X(k) and Y(k) represent spectrum obtainable by executing DFT and DCT processings. N represents the number of sampling points, C and D are constants, and A represents an order number equal to an integer of from 0 to N − 1.

These transforms are generally made by storing the tables of sine and cosine on the righthand sides of equations (1) and (2) in a ROM and then effecting product and addition operations of the stored values and x(n) and y(n). The deviation angles of sine and cosine are shown in the following Tables VI and VII,

TABLE VI

| | n | | | | |
|---|---|---|---|---|---|
| k | 0 | 1 | 2 | 3 | ... N − 1 |
| 0th order coefficient | $\frac{0}{N}\pi$ | $\frac{0}{N}\pi$ | $\frac{0}{N}\pi$ | $\frac{0}{N}\pi$ | ... $\frac{0}{N}\pi$ |

TABLE VI-continued

| k | n=0 | n=1 | n=2 | n=3 | ... | n=N−1 |
|---|---|---|---|---|---|---|
| 1st order coefficient | $\frac{0}{N}\pi$ | $\frac{2}{N}\pi$ | $\frac{4}{N}\pi$ | $\frac{6}{N}\pi$ | ... | $\frac{2(N-1)}{N}\pi$ |
| 2nd order coefficient | $\frac{0}{N}\pi$ | $\frac{4}{N}\pi$ | $\frac{8}{N}\pi$ | $\frac{12}{N}\pi$ | ... | $\frac{4(N-1)}{N}\pi$ |
| . | . | . | . | . | | . |
| (N−1)th order coefficient | $\frac{0}{N}\pi$ | $\frac{2(N-1)}{N}\pi$ | $\frac{4(N-1)}{N}\pi$ | $\frac{6(N-1)}{N}\pi$ | ... | $\frac{2(N-1)^2}{N}\pi$ |

TABLE VII

| k | n=0 | n=1 | n=2 | n=3 | ... | n=N−1 |
|---|---|---|---|---|---|---|
| 0th order coefficient | $\frac{0}{2N}\pi$ | $\frac{0}{2N}\pi$ | $\frac{0}{2N}\pi$ | $\frac{0}{2N}\pi$ | ... | $\frac{0}{2N}\pi$ |
| 1st order coefficient | $\frac{1}{2N}\pi$ | $\frac{3}{2N}\pi$ | $\frac{5}{2N}\pi$ | $\frac{7}{2N}\pi$ | ... | $\frac{2(N-1)}{2N}\pi$ |
| 2nd order coefficient | $\frac{2}{2N}\pi$ | $\frac{6}{2N}\pi$ | $\frac{10}{2N}\pi$ | $\frac{14}{2N}\pi$ | ... | $\frac{2(2N-1)}{2N}\pi$ |
| . | . | . | . | . | | . |
| (N−1)th order coefficient | $\frac{N-1}{2N}\pi$ | $\frac{3(N-1)}{2N}\pi$ | $\frac{5(N-1)}{2N}\pi$ | $\frac{7(N-1)}{2N}\pi$ | ... | $\frac{(2N-1)(N-1)}{2N}\pi$ |

However, since these trigonometric functions are functions having a period of 2, functions of from $0=(2m+1)$ to $0=(2m+2)$ can be obtained by merely reversing the signs of the functions of from $\theta=2m\pi$ to $\theta=(2m+1)$. For this reason, it is usual to save the memory capacity by storing functions of from $0=0$ to $0=\pi/2$ or $0=$ in a ROM so as to repeatedly use them. Consequently, the ROM tables required for effecting DFT and DCT processings regarding n points are shown in the following Tables VIIIA, VIIIB and IX corresponding to N words and 2N words. Table VIII shows the DFT processing while Table X the PCT processing.

TABLE VIII

| | (A) Address Data | (B) Address Data | |
|---|---|---|---|
| 0 | $\cos\frac{0}{N}\pi$ | $A_0 + 0$ | $\sin\frac{0}{N}\pi$ |
| 1 | $\cos\frac{2}{N}\pi$ | $A_0 + 1$ | $\sin\frac{2}{N}\pi$ |
| 2 | $\cos\frac{4}{N}\pi$ | $A_0 + 2$ | $\sin\frac{4}{N}\pi$ |
| 3 | $\cos\frac{6}{N}\pi$ | $A_0 + 3$ | $\sin\frac{6}{N}\pi$ |
| . | . | . | . |
| $\frac{N}{2}-1$ | $\cos\frac{N-2}{N}\pi$ | $A_0 + \frac{N}{2}$ | $\sin\frac{N-2}{N}\pi$ |

TABLE IX

| | (A) Address Data |
|---|---|
| 0 | $\cos\frac{0}{2N}\pi$ |
| 1 | $\cos\frac{1}{2N}\pi$ |
| 2 | $\cos\frac{2}{2N}\pi$ |
| 3 | $\cos\frac{3}{2N}\pi$ |
| . | . |
| 2N−1 | $\cos\frac{2N-1}{2N}\pi$ |

In this embodiment, in the modulo mode the following operations are made. The DFT processing will be described first.

DFT processing mode

In the DFT processing mode, the first and second counters 47 and 48 are reset when they are supplied with a processing start signal ST from CPU200. Furthermore, the arithmetic circuit 57 sends a mode designation signal MS1C2 which selects the output of the second counter 48, via the OR gate circuit 73. Furthermore, the arithmetic circuit 57 sends out a selection signal MS2R3 which selects the third register 56, via the OR gate circuit 73. In the DFT mode, the first selector 51 always selects the output of second counter 48, and the second selector 53 always selects the third register 56. Further, in this mode, the CPU200 sets data in the second register 50 having a circulating period of N/2 ($=2^{I-1}$) wherein lower order I-1 bits are all "1" and the other bits are "0". Also in this mode in which selector 66 operates a shift signal SS(1) meaning leftward shift signal is sent to shift circuit 52. The arithmetic circuit 10 starts to operate under this state. The output k of the second counter 48 is shifted one bit to the left by the shift circuit 52 via the first selector 51 and then applied to the first input of adder 54 through first selector 51 as an address increment 24. The previous address of the third register 56 is applied to the second input of the adder 54 via the second selector 53. As a consequence, the sum of the adder 54 is applied to the AND gate circuit 55 together with each bit of the second register 50 and the output of this AND gate circuit 55 is applied to the third register 56 to form a new address. The count of the first counter 47 is incremented by one each time the third register 56 is removed. More particularly, the first counter 47 counts up at each clock which is the same as that applied to the third register 56 for setting. The operation described above is repeated until the output of the first counter 47 becomes N−1 so that N addresses are formed to be utilized to refer the coefficient table regarding the kth order DFT processing. When the output of the first counter 47 becomes N−1, the first counter 7 is reset by the arithmetic circuit 57 and the second counter 48 is also reset by the arithmetic circuit 57 and incremented by 1. Thus, the constant setting register 68 is set with the constant N−1, and the count of the first counter 47 is compared with N by the comparator 61. When they coincide with each other, a coincidence signal CS1 is produced and reset signal RS1 and RS2 are sent to the first and second counter 47 and 48 respectively through the AND gate circuits 80 and 79, and the second counter 48 sends an increment signal INC via the AND gate circuit 78. When the coincidence signal CS1 is formed, the AND gate circuit 85 is enabled to apply the reset signal RS3 to the third register 56 to reset the same, whereby the order number k is renewed. For the address increment 2 (k+1), the same operation is repeated so that the (k+1)th address is continuously outputted from the third register 56. The renewal of the order number k is repeated until the output of the second counter 48 becomes N−1, and when the output of the second counter 48 becomes N, the comparator 62 of the arithmatic circuit 57 produces a modulo mode processing end signal ED1. At this time, the address arithmetic circuit 10 terminates its operation.

In the address arithmetic circuit of this invention, the carry of more than I bits of the output of the adder is neglected by the AND gate circuit, and "0" is set in all these bits, so that the initial address is automatically given when returning to the first portion of the ROM, whereby the circulating address circulating at a period of N/2 is continuously produced. The DCT processing will now be described.

DCT Processing mode

As in the mode described above, the first and second counters 47 and 48 are reset when supplied with a processing start signal ST from CPU200. At this time a mode designation signal MS1C2 selecting the second counter 48 is sent to the first selector 51 via the AND gate circuit 81 and the OR gate circuit 73. Furthermore, a selection signal MS2R3 selecting the third register 56 is sent to the second selector 53 via OR gate circuit 74, AND gate circuit 83 and OR gate circuit 75. Accordingly, the DCT mode, the first selector 51 selects the output of the first counter 47, while the second selector 53 firstly selects the output of the third register 56.

The second register 50 is set with data having a circulation period of 2N ($=2^{I-1}$) wherein lower order I-1 bits are all "1" and the other bits are "0". The selector 66 of the arithmatic circuit 57 selects a signal which shifts the bits to the left to supply a shifted signal SS(1) to the shift circuit 52. The operation is started under this state. The output of the second counter 48 is applied to the shift circuit 52 via the first selector 51 to be shifted one bit toward left, and the output of the shift circuit 52 is applied to the first input of the adder 54. The previous address of the third register 56 is supplied to the second input of the adder 54 via the second selector 53 and the output of the adder 54 is applied to the AND gate circuit 54 together with each bit of the second register 50. The output of the AND gate circuit 54 is set in the third register 56 by the timing action of the clock to form a new address. Each time the third register 56 is renewed, the first counter 47 is incremented by 1. Because the first counter 47 is supplied with the same clock as the third register 56. Above described operation is repeated until the output of the first counter 47 becomes (N−1) so as to generate N addresses in order to refer to the coefficient table of the 0th DCT processing. As the output of the first counter 47 becomes (N−1), the comparator 61 produces a coincidence signal CS1. Then a reset signal RS1 is sent to the first counter 47 via the AND gate circuit 78 which sends an increment signal INC to the second counter 48. Consequently, the first and second counters 47 and 48 are reset and incremented by one by the arithmetic circuit 57. Furthermore, when the coincidence signal CS1 is sent out, a mode designation signal MS1C1 is sent via the AND gate circuit 82 and the OR gate circuit 96 so that the output of the first counter 47 could be selected as an input to the first selector 51. Further, the AND gate circuit 84 is enabled by the coincidence signal CS1 so that a selection signal MS2C2 which selects the second counter 48 is sent to the second selector 53. As a consequence, the first selector 51 selects the output of the first counter 47, whereas the second selector 53 selects the output k of the second counter 43 to set the starting address k of the k th order coefficient is set in the third register 56 to renew its order number. After the renewal of the order number k, selectors 51 and 53 are returned to their original states in which the outputs of the first counter 47 and of the third register 56 respectively are selected. Renewal of the order number k is repeated until the output of the second counter 48 becomes N−1. Then the second counter 48 is reset and the comparator 62 produces a processing end signal ED1, this terminating the operation of the address arithmatic circuit.

(d) bit reverse mode . . . FFT processing

The FFT processing is an algorism for executing the DFT processing at a high speed, which is executed by interchanging the order of the data series by the bit reversal and by the butterfly computation. Interchanging of the date by the bit reversal is done by repeatedly transferring odd numbered data of the series to the latter half wherein the order of the data series shown by binary numbers $b_{N-1} \ldots b_2, b_1, b_0$ is rearranged to a new order of $b_0, b_1, b_2 \ldots b_{N-1}$. Generally, this operation is made by transferring the data stored in the memory unit and executed by obtaining the address of the bit reverse address to which the transfer is made, from the address arithmetic circuit.

In this mode, the bit reverse addresses are obtained according to the following principle. A difference between values obtained by bit reversing containing binary values x and x+1 each N continuous bits is calculated. The binary value x of N bits is expressed by $$x = \sum_{k=0}^{N-1} b_k \cdot 2^k \quad (6)$$

when $b_k$ is a value (k+1) bits from the lower order bit. Assume now that the lower k bits of x are "1" that is $b_0 = b_1 = \ldots b_{k-1} = $"1" and $b_k = 0$, then x+1 is expressed by $$x + 1 = \sum_{k=0}^{i-1}(b_k - 1) \cdot 2^k + (b_i + 1)2^i + \sum_{k=i+1}^{N-1} b_k \cdot 2^k \quad (7)$$

when values obtained by bit reversal of x and x+1 are expressed by BR(x) and BR(x+1)

$$BR(x) = \sum_{k=0}^{N-1} b_{N-1-k} \cdot 2^k \quad (8)$$

$$BR(x + 1) = \sum_{k=0}^{N-i-2} b_{N-1-k} \cdot 2^k + (b_i + 1)2^{N-k-1} + \sum_{k=N-i}^{N-1}(b_{N-1-k} - 1)2^k \quad (9)$$

Usually BR(x+1) can be obtained by incrementing or decrementing BR(x). Which one is used is determined according to x. Suppose now that these values circulate with a period of $2^N$, BR(x+1) can always be obtained by incrementing BR(x). Where the difference between BR(x+1) and BR(x) is obtained by introducing a circulating address having a period of $2^N$ from equations (8) and (9) we can obtain.

$$BR(x+1) - BR(x) + 2^N = 3 \cdot 2^{N-i-1} \quad (10)$$

where all lower bits of x can be represented by "1"; when N bits are reversed, the increment of the value BR(x+1) for BR(x) is obtained by shifting to right by i bits $3 \cdot 2^{N-1}$ by introducing circulating address.

In this example, the operation of the bit reverse mode is done in the following manner.

In the same manner as the other modes described above, when CPU 200 produces a processing start signal ST, the first and second counters 47 and 48 are set, while the third register 57 is reset. Data $3 \cdot 2^{N-1}$ is set in the first register 49 and data wherein lower order N bits are all "1" and the other bits are "0" are set in the second register 50.

In the arithmatic circuit 57, a mode designation signal MS1R1 which selects the output of the first register 49 via the OR gate circuits 91 and 97 is sent to the first selector 51. Further, a selection signal MS2R3 that selects the output of the third register 56 via the OR gate circuits 92 and 75 is sent to the second selector 53. The selector 66 selects the output of the decoder 64 to send out a shift signal SSi to shift circuit 52. The operation of the arithmatic circuit 10 is started under this state.

The data $3 \cdot 2^{N-1}$ in the first register 49 is shifted to the right by k bits by the shift circuit 52, and the shifted data is applied to one input of the adder 54 to increment the address. The previous address of the third register 56 is applied to the other input of the adder 54 to produce the next address signal which is applied to the AND gate circuit 55 together with each bit data in which only the lower N bits of the second register 50 are all "1". In this case, the orders of the addresses higher than N+1 bit are neglected, so that the output of the AND gate circuit 55 is "0". When the arithmatic circuit 57 controls such that the number of shifts i of the shift circuit 52 is made to be equal to the number of bits in which the lower order bits of the output of the first counter 47 becomes all "1", a bit reverse address of N bits is continuously obtained from the third register 56. The above described shift arithmatic operation of the arithmetic circuit 57 is obtained by the shift number i obtainable by decoding with the decoder 64 the output of the first counter 47 according to Table II.

As above described, by using the concept of the circulating signal various memory addressings of various modes which are indispensable to be digital processing of such analogue signals as the speech signal can be made with only one set of component elements, thus greatly simplifying the address arithmetic circuit of the memory unit used when digitally processing such analogue signals as speech signals. More particularly, according to the address arithmetic circuit of this invention, it is possible to initially generate and control complex addresses of many types which are indispensable for processing digital signals with comparable or lesser number of circuit elements than an exclusive address arithmetic circuit which has been used for indivisual address arithmetic mode. Accordingly, the arithmetic circuit of this invention can be formed on a LSI chip for digital signal processing. As the arithmetic circuit of this invention operates in set modes the operation of the CPU can readily be synchronized by controlling the operation or nonoperation of the address arithmetic circuit with a microinstruction. As a consequence, the address arithmetic and the arithmetic operation can be executed in parallel, thus increasing the speed of processing.

It should be understood that the invention is not limited to the specific embodiment described above and that many changes and modifications can be made without departing from the true spirit and scope of the invention as defined in the appended claims. For example, instead of using speech signals image signals can also be used as the analogue signals. Further the output ED2 corresponds to the output of the comparator 61. Therefore, the output CS1 of the comparator 61 may be also used as the ED2 signal to be sent to the CPU 200 so that the comparator 63 and the registor 70 are omitted.

What is claimed is:

1. An address arithmatic circuit used for generating addresses for a memory unit used in digitally processing of analog signals wherein different address control signals are required for different signal processing algorithms, said address arithmatic circuit comprising:
first and second counters;
first and second registers, and a third register acting as an address register of said memory unit;

a first selection circuit for selecting either one of the outputs of said first or second counters and of said first register;

a shift circuit for shifting an output of said first selection circuit;

a second selection circuit for selecting either one of the outputs of said second counter or said third register;

an adder for adding together outputs of said shift circuit and said second selection circuit;

an AND gate circuit for obtaining a logical product of an output of said adder and an output of said second register for each bit, and for setting said logical product in said third register;

a controller including first, second, third and fourth arithmetic circuits, said first arithmetic circuit resetting said first counter and incrementing said second counter in accordance with the output of said first counter, said first arithmetic circuit resetting said second counter, said second arithmetic circuit controlling selection operation of said first and second selectors, said third arithmetic circuit controlling a number of shifts of said shift circuit, said fourth arithmetic circuit resetting said third register.

* * * * *